United States Patent
Hurrell

(10) Patent No.: US 7,924,203 B2
(45) Date of Patent: Apr. 12, 2011

(54) MOST SIGNIFICANT BITS ANALOG TO DIGITAL CONVERTER, AND AN ANALOG TO DIGITAL CONVERTER INCLUDING A MOST SIGNIFICANT BITS ANALOG TO DIGITAL CONVERTER

(75) Inventor: Christopher Peter Hurrell, Berkshire (GB)

(73) Assignee: Analog Devices, Inc., Norwood, MA (US)

( * ) Notice: Subject to any disclaimer, the term of this patent is extended or adjusted under 35 U.S.C. 154(b) by 18 days.

(21) Appl. No.: 12/483,505

(22) Filed: Jun. 12, 2009

(65) Prior Publication Data

US 2010/0315278 A1 Dec. 16, 2010

(51) Int. Cl.
*H03M 1/12* (2006.01)
(52) U.S. Cl. .................... 341/156; 327/307
(58) Field of Classification Search .......... 341/144–172; 327/307, 345; 455/223; 324/174, 612, 615
See application file for complete search history.

(56) References Cited

U.S. PATENT DOCUMENTS

| | | | | |
|---|---|---|---|---|
| 5,502,441 | A * | 3/1996 | Swenson | 341/172 |
| 5,784,016 | A * | 7/1998 | Nagaraj | 341/172 |
| 6,288,669 | B1 * | 9/2001 | Gata | 341/172 |
| 6,707,403 | B1 * | 3/2004 | Hurrell | 341/120 |
| 7,348,824 | B2 * | 3/2008 | Naviasky et al. | 327/307 |
| 7,675,446 | B2 * | 3/2010 | Liu | 341/172 |
| 2003/0197636 | A1 | 10/2003 | Confalonieri et al. | |
| 2007/0115159 | A1 | 5/2007 | Tachibana et al. | |
| 2008/0198056 | A1 | 8/2008 | Hurrell | |
| 2008/0272952 | A1 | 11/2008 | Wood | |

OTHER PUBLICATIONS

PCT International Search Report and Written Opinion for PCT/US10/34348 mailed on Jun. 23, 2010.

* cited by examiner

*Primary Examiner* — Lam T Mai
(74) *Attorney, Agent, or Firm* — Kenyon & Kenyon LLP

(57) ABSTRACT

A most significant bits analog to digital converter for determining a first P bits of an N bit analog to digital conversion, the most significant bits analog to digital converter comprising: a digital to analog converter a capacitive attenuator, and a switching arrangement for inhibiting action of the attenuator during sampling and enabling the attenuator during conversion.

15 Claims, 5 Drawing Sheets

MOST SIGNIFICANT BITS ANALOG TO DIGITAL CONVERTER, AND AN ANALOG TO DIGITAL CONVERTER INCLUDING A MOST SIGNIFICANT BITS ANALOG TO DIGITAL CONVERTER

FIELD OF THE INVENTION

The present invention relates to analog to digital converters.

BACKGROUND OF THE INVENTION

Analog to digital converters typically compare a voltage that has been sampled onto a sampling capacitor with a plurality of voltages to see which voltage best represents the sampled voltage. The plurality of voltages are often provided by a digital to analog converter, DAC. Various analog to digital converter technologies exist. In simplistic designs the voltage on the sampling capacitor is provided to one input of a comparator and the output of the digital to analog converter is provided to the other input of a comparator. The comparator output is supplied to a controller which determines which DAC voltage best approximates the input voltage.

Low power devices are of increasing significance due to battery life and heat dissipation concerns. Generally power dissipation can be reduced by lowering supply voltage. Within an analog to digital converter different components may run at different supply voltages and the voltage at the comparator may be relatively low, say around 2 volts or so.

Using low comparator voltages brings its own problems. The transistors formed within the comparator have parasitic components associated with them, and in particular the formation of switches connected to the input transistors gives rise to parasitic diodes at the comparator input, and if the input to the comparator falls outside the power supply range for the comparator then these parasitic diodes can switch on thereby allowing charge to be lost from the sampling capacitor. If this happens then the result of the analog to digital conversion process is unreliable. Also, voltage excursions outside of the supply rails may damage a device.

SUMMARY OF THE INVENTION

According to a first aspect of the present invention there is provided a most significant bits analog to digital converter for determining a first P bits of an N bit analog to digital conversion, the most significant bits analog to digital converter comprising: a digital to analog converter, a capacitive attenuator, and a switching arrangement for inhibiting action of the attenuator during sampling and enabling the attenuator during conversion.

It is thus possible to compensate for discrepancies between performance of the most significant bits (MSBS) analog to digital converter and a main analog to digital converter.

As used herein the term "main analog to digital converter" will be used to refer to an analog to digital converter which is used to convert the majority of the bits in an analog to digital conversion.

According to a second aspect of the present invention there is provided a method of performing an analog to digital conversion using a converter comprising a main analog to digital converter and a most significant bits analog to digital converter, and where the most significant bits analog to digital converter comprises a sampling capacitor, a digital to analog converter, a capacitive attenuator and a comparator, the capacitive attenuator acting to attenuate a signal received by the comparator, wherein a switching arrangement is provided in combination with the capacitive attenuator for inhibiting the action of the attenuator during sampling of a signal onto the sampling capacitor.

Advantageously the sampling capacitor may be provided by capacitors within a switched capacitor array of the digital to analog converter.

BRIEF DESCRIPTION OF THE DRAWINGS

The present invention will further be described, by way of example only, with reference to the accompanying drawings, in which.

DESCRIPTION OF PREFERRED EMBODIMENTS OF THE INVENTION

Figure 1:
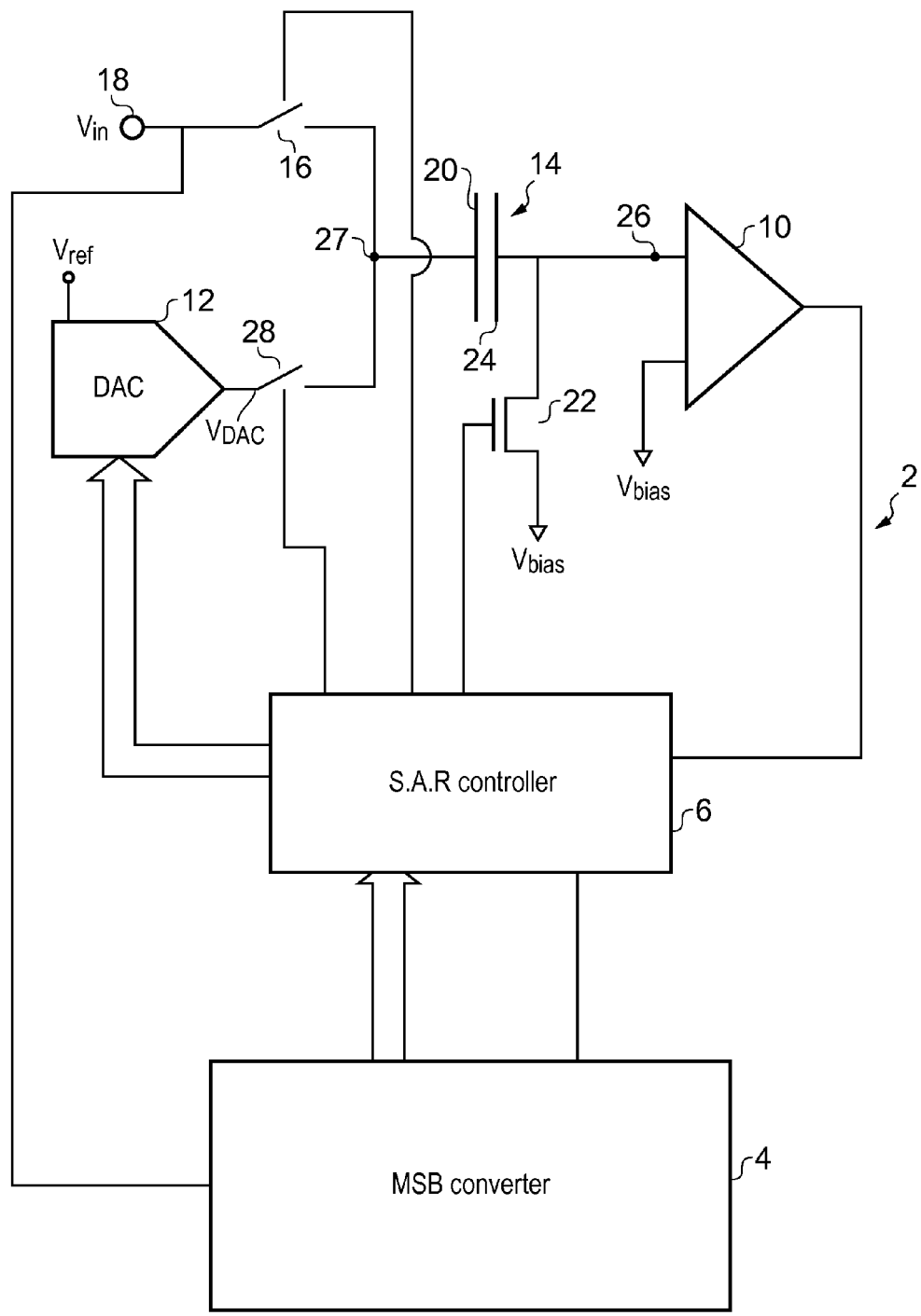
FIG. 1 schematically illustrates an analog to digital converter constituting an embodiment of the present invention.

FIG. 1 schematically illustrates an analog to digital converter constituting an embodiment of the present invention. The analog to digital converter comprises a main analog to digital converter generally designated 2, a most significant bits, MSB, converter 4, and a successive approximation routine, SAR, controller 6. Advantageously the main analog to digital converter includes redundancy so to be able to recover from an incorrectly kept bit, if for example, there is a slight difference between the decision thresholds for the main and MSB converters. The use of redundant bits is discussed in greater detail in U.S. Pat. No. 6,828,927, which is incorporated by reference, and more particularly to column 6 lines 30 to 41 and column 7 line 20 to column 9 line 38.

An input 18 is connected to the MSB converter 4 and is selectively connectable to an intermediate node 27 of the main converter 2 via an electronically controlled switch 16. Similarly a digital to analog converter, DAC, 12 can be connected to the intermediate node via a switch 28. A sampling capacitor 14 has a first plate 20 connected to the intermediate node 27 and a second plate 24 connected to an output node 26. A first input of a comparator 10 is connected to the output node 26, and a second input is connected to a bias voltage, Vbias, provided by a suitable voltage generator or a ground connection if Vbias is zero volts. A second electronically controlled switch 22 extends between the second plate 24 of the capacitor 14 and the bias voltage, Vbias. As will be discussed later the sampling capacitor 14 may comprise a plurality of capacitors within the DAC.

The SAR controller 6 is responsive to the comparator 10 within the main converter 2.

The SAR controller 6 controls the digital to analog converter, DAC, 12. In use the SAR controller selectively sets the bits (or bit weights) within the DAC to trial the contribution of the bits in sequence in conjunction with the combination of any previously kept bits, as is known to the person skilled in the art. The output of the DAC 12 is compared with a voltage sampled onto the sampling capacitor 14. This comparison is done, in this example, by summing the output of the DAC 12 with the voltage on the capacitor 14, and comparing the result with the voltage Vbias.

It is worthwhile considering the voltage sampling and comparison processes in detail at this time. At the start of sampling, switch 16 is closed, thereby allowing the voltage at an input terminal 18 to be applied to the first plate 20 of the sampling capacitor 14. The switch 16 is formed by a field effect transistor. At or about the same time the second switch, formed by transistor 22, is closed such that a second plate 24 of the capacitor 14 is connected to Vbias.

During sampling the sampling capacitor 14 is in series with switches 16 and 22. In practice switch 16 typically has a significantly lower resistance than switch 22 and so for this discussion its impedance is ignored. The impedance of the sampling capacitor 14 is frequency dependent whilst that of switch 22 is frequency independent (assuming no parasitic capacitance). For a sinusoidal input the magnitude of the impedance Zc of the sampling capacitor 14 is given by $$Zc=1/(2 \cdot \pi \cdot F \cdot C)$$

Where
F is the input frequency in Hertz, and
C is the capacitance of the sampling capacitor As the frequency term F is in the denominator, Zc decreases with input frequency while the impedance of switch 22 remains fixed. As a result, more of the input signal appears across switch 22 at higher input frequencies.

The magnitude of the voltage, Ve, across the switch 22 for a sinusoidal input is given by $$Ve=1/(1+1/(2 \cdot \pi \cdot F \cdot R \cdot C)^2)^{0.5}$$

Where
R is the resistance of switch 22, and
C is the capacitance of the sampling capacitor 14

Thus the voltage across the sampling capacitor at any instant is reduced from Vin to Vin–Ve.

We will come back to this later, but at the moment we will assume that a direct current signal is being sampled and that the sampling period is sufficiently long for Ve to be zero.

At the end of the sampling period switch 22 is made high impedance, and shortly after that switch 16 is also made high impedance. The voltage Vin–Vbias has been stored on the sampling capacitor 14.

At this point we have no idea what the value of Vin is. It is however worth noting that the voltage at plate 24 of the capacitor 14 is Vin–Vbias less than the voltage at plate 20. Consequently, if plate 20 was connected to ground then the voltage at a first input 26 of the comparator 10 would be –(Vin–Vbias) which would be –Vin if Vbias=0.

In converters not having an MSB converter 4, the SAR controller 6 uses the DAC 12 of the main converter to test all of the bits required to complete the analog to digital conversion.

This would mean setting the most significant bit of the DAC 12 whilst leaving all other bits unset. Thus, if the reference voltage to the DAC 12 is Vref, then the output is set to Vref/2.

Consequently the voltage of the input 26 to the comparator 10 is (Vref/2)–Vin+Vbias If, for simplicity, we set Vbias=0, then we can identify an input voltage, Vmsb, that equals the threshold voltage for the first bit trial, Vmsb=Vref/2

The comparator 10 then compares the voltage with Vbias, in effect working out whether Vref/2 is greater than Vin or less than Vin. If Vin is greater than Vref/2 then the first bit is kept, otherwise it is discarded. The SAR controller then asserts the next bit so that next word being tested is 11000 . . . if the first bit was kept or 01000 . . . if the first bit was discarded.

This process is repeated for each bit from the most significant bit, MSB, to the least significant bit, LSB, in sequence thereby achieving the analog to digital conversion.

The voltage at the input of the comparator 10 during a bit trial is Vbias–Vin+Vdac, where Vdac is the output voltage of the digital to analog converter 12. During a successive approximation conversion Vdac converges with Vin, so by the end of the trial the voltage at the input to the comparator 10 is very close to Vbias.

If, for the purposes of discussion we allow Ve to be non-zero then we see that the value for Vmsb changes to Vmsb=(Vref/2)+Ve Returning to considering the operation of the ADC, it can be seen that large voltage excursions at the output node 26, and consequently at the input of the comparator 10, only exist for the first one or two bit trials.

If the first few bits could be determined then the comparator 10 could be designed to work at a lower supply voltage resulting in lower power consumption. The lower supply voltage also allows the use of faster, lower geometry devices giving further power and speed benefits.

Figure 2:
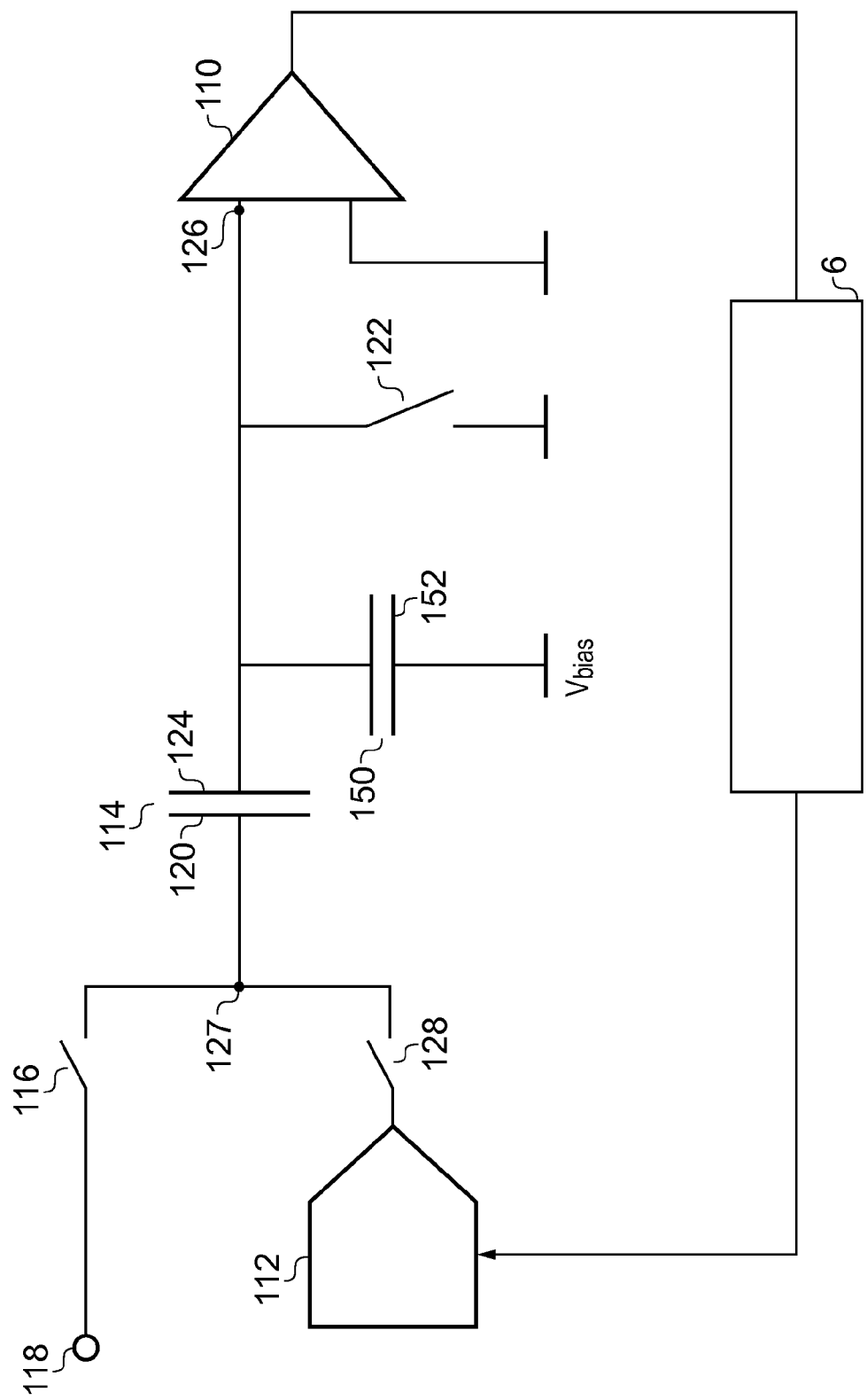
FIG. 2 schematically illustrates the internal configuration of a prior art most significant bits analog to digital converter.

One way to achieve these objectives is to provide a MSB converter 4. FIG. 2 shows the structure of an MSB converter constituting an embodiment of the invention in greater detail.

The topology is similar to that of the main converter, and like parts are indicated by numerals 100 greater than used in FIG. 1. The DAC 112 is much simplified and is configured to only test the first P bits (P typically=1, 2 or 3) of the N bit conversion. N is typically 14, 16 or 18.

The sampling capacitor 114, which can be regarded as a first capacitor, is associated with a second capacitor 150 so as to form a capacitor voltage divider, i.e. a capacitive attenuator. The second capacitor 150 has one plate connected to the plate 124 of the first capacitor 114. In some prior art MSB converters the bottom plate 152 of the second capacitor 150 is directly connected to Vbias, in others the second capacitor is provided as a parasitic component.

The bandwidths of the main and MSB analog to digital converters are matched. This is assumed in prior art designs to be sufficient to ensure proper operation.

However the inventor has realised that contrary to accepted wisdom the operation of the MSB converter 4 is subject to error as the input bandwidth increases.

Although the signal sampled on to the sampling capacitors 14 and 114 is acceptably similar in both the MSB converter 4 and the main converter 2, the effect of the capacitor attenuator is to introduce an error between these two converters such that the MSB decisions determined by the MSB converter when applied to the main converter can result in unacceptable errors.

As noted before the affect of a high input frequency signal during acquisition is to impose a signal Ve on node 126 (representing the output of the attenuator and input to the comparator) which is proportional to the derivative of the input signal. Directly after sampling, plate 120 of the first capacitor 114 (sampling capacitor) is at Vin whilst it other terminal 124 is at Ve.

To test, for example, the MSB decision the DAC output would be set to Vref/2 and switch 128 would be closed. The voltage on the comparator input Vcomp is, assuming Vbias=0, given by $$Vcomp = Ve + [(Vref/2 - Vin) * C1/(C1+C2)]$$

That is, the comparator input voltage is equal to Ve plus the change in the voltage on node 27 between sampling and when set to Vref/2, that is [(Vref/2)−Vin] attenuated by the capacitor attenuator formed by first capacitor 114 having a capacitance C1 and the second capacitor 150 having capacitance C2. The transfer function between nodes 127 and 126 for this capacitive divider can be expressed as [C1/(C1+C2)].

Rearranging this equation and setting the voltage at the input to the comparator to zero (assuming Vbias=0) we can see what input voltage Vin corresponds to the MSB threshold voltage Vmsb:

$$Vmsb = Vref/2 + (Ve*(C1+C2)/C1)$$

This equation also applies to the main converter. However, in the main converter C2 is not present and hence its value in the above equation is zero. Clearly since in one case C2 has a significant value, it can be as large as or greater than C1, and in the main converter it is zero, Vmsb can be significantly different for the two converters. Note that in the case of a DC or a slowly moving input signal Ve is zero or close to zero in which case Vmsb will be the same (or very nearly the same) for both the main DAC and MSB DAC. It is therefore the existence of a significant Ve, due to a moving input voltage, plus the fixed attenuating capacitor C2, that gives rise to the error.

Figure 3:
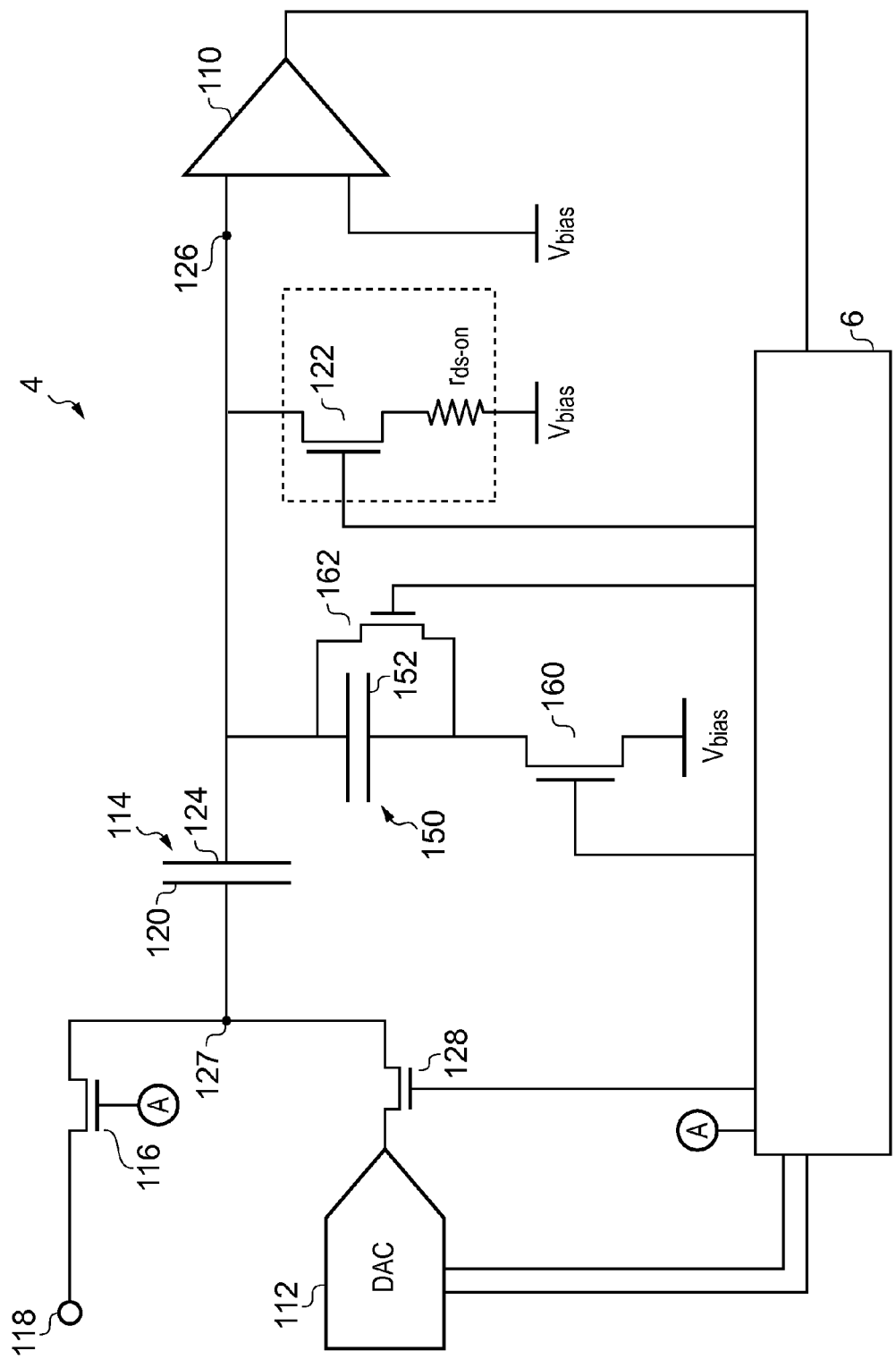
FIG. 3 schematically illustrates the internal configuration of a most significant bits analog to digital converter constituting an embodiment of the present invention.

In an embodiment of the invention, shown in FIG. 3, the prior art arrangement of FIG. 2 is modified by the inclusion of a first additional switch 160 interposed between terminal 152 of the second capacitor 150 and Vbias, and a second additional switch 162 across the second capacitor 150.

The switches are controlled by the SAR controller 6 (or some other controller) such that during acquisition switch 162 is closed (low impedance) and switch 160 is open. The second capacitor 150 does not therefore present a load to the MSB converter's input sampling network during the sampling phase. With a time varying input signal there will be a voltage Ve on node 126 and the same voltage on the equivalent node 26 in the main converter.

Directly after sampling both switches 122 and 116 are turned off. Consequently both terminals of the second capacitor 150 are at Ve. Switch 162 is then opened and switch 160 is closed. Node 127 is floating. The affect of closing switch 160 is to pull nodes 126 and the bottom plate 152 of the second capacitor 150 to Vbias, which may be zero Volts (Vbias=0) and node 127 is pulled to Vin−Ve.

On closing switch 128 the output of the DAC 112 is provided to the circuit and this gives rise to a comparator input voltage Vcomp for the MSB bit decision given by $$Vcomp = (Vref/2 - (Vin - Ve))*C1/(C1+C2)$$

Again, by setting Vcomp to zero (assuming Vbias=0) allows us to determine what input voltage corresponds to the MSB voltage (Vin=Vmsb):

$$0 = (Vref/2 - (Vmsb - Ve))*C1/(C1+C2)$$

By multiplying both sides by (C1+C2)/C1 we get $$0 = Vref/2 - (Vmsb - Ve)$$

Then making Vmsb the subject, we see that $$Vmsb = Vref/2 + Ve$$

So with this circuit the input voltage corresponding to the MSB threshold is independent of both C1 and C2 and so the MSB converter and main converter can be expected to have the same decision threshold Vmsb.

Thus the errors in the MSB converter due to high frequency components in a signal can be made to scale more closely with the main DAC, even though the MSB converter includes a capacitor based attenuator so as to avoid the risk of driving an input signal to the comparator out of range.

The DACs 12 and 112 can be single ended or dual ended. The converters can be fabricated as switched capacitor devices, in which case the capacitors of the DACs 12, 112 can also function as the sampling capacitors. In such an arrangement the attenuation circuit amounts to selectively connecting and disconnecting a load capacitor to the signal path extending from the DAC to the associated comparator.

Furthermore, as the MSB DAC is only required to provide output signals for the first one, two or three bit trials it can be formed from capacitors of the same size as one another, and hence can be formed of a "unit" sized capacitor, thereby allowing the MSB DAC to be physically small.

Figure 4:
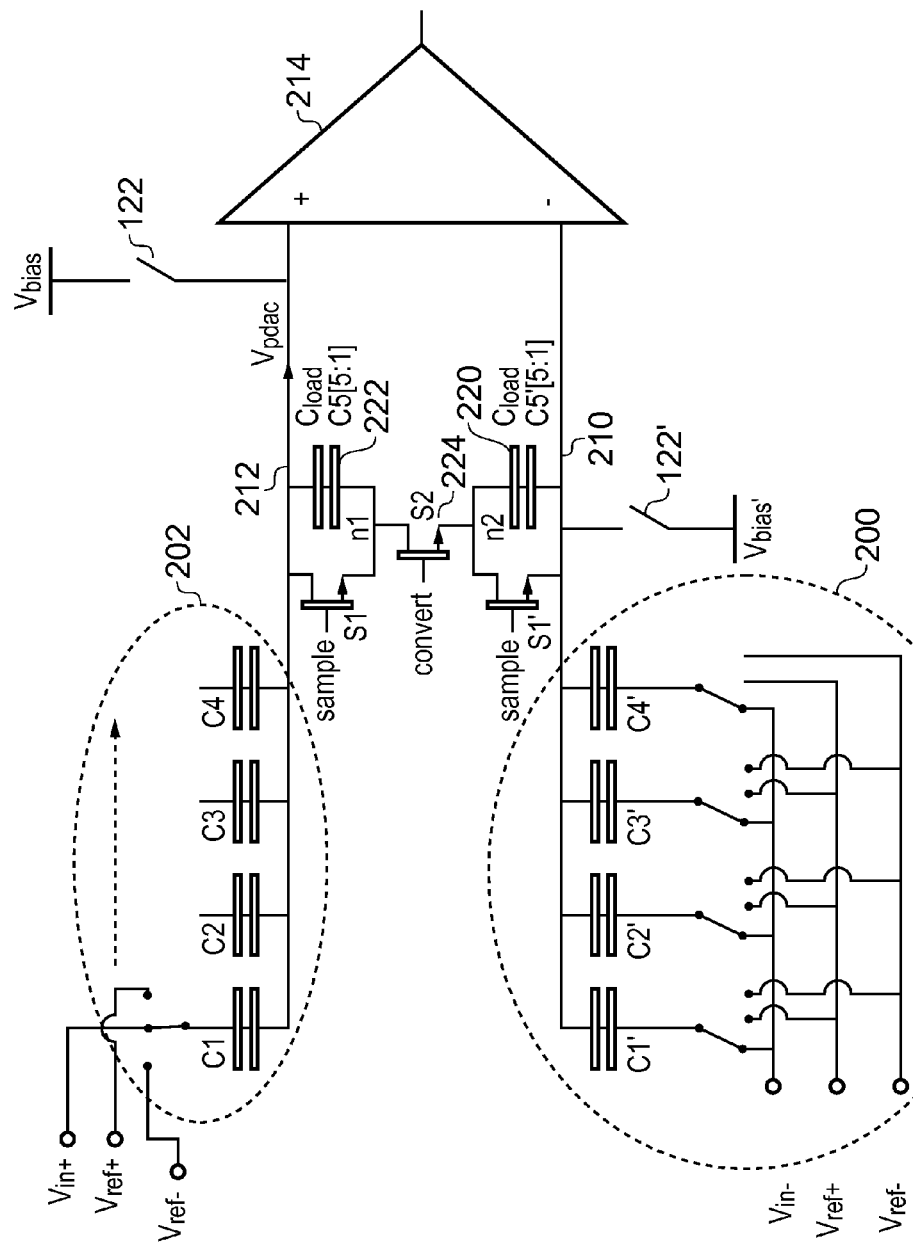
FIG. 4 illustrates a switched capacitor dual ended most significant bit converter constituting a further embodiment of the present invention.

FIG. 4 shows a MSB converter comprising two channels so as to act as a differential converter. For simplicity only the "negative" channel will be described in detail.

Given the DAC 200 is only required, in this example, to output 4 voltage levels corresponding to 0, 0.25, 0.5, 0.75 Vmax then it can be fabricated from four equal sized capacitors C1' to C4'. Each has a "top plate" connected to an output 210 of DAC 200. Each bottom plate is selectively connectable via associated switches to Vin− to sample the signal, or Vref+ or Vref− during conversion. As the switches are implemented as three transistors we also have a "not connected" condition available.

The capacitors in the positive channel DAC 202 are similarly associated with switches to connect them to Vin+, Vref+ and Vref−. The outputs 210 and 212 of the DACs are connected to respective inputs of a comparator 214.

Attenuation or load capacitors for use in the capacitive attenuator are provided as capacitors 220 and 222 in series connection between lines 210 and 212 with a series switch 224 provided to isolate them from one another. Each capacitor 220 and 222 has a respective shorting switch.

Thus as before each attenuation capacitor can effectively be disconnected or removed during sampling and inserted or connected during conversion.

For completeness, the operation of the "negative" channel will be briefly considered. To sample the input C1' to C4' are connected to Vin− and the switch 122' is closed. After sampling has been completed (122' now open) the first bit trial may be set up by connecting C1' and C2' to Vref+; and C3' and C4' to Vref−. The second bit trial will have 3 out of 4 of capacitors C1' to C4' connected to Vref+ or Vref− (as appropriate and determined by the MSB trial) and the other capacitor connected to the other one of Vref+ and Vref−.

In use, the MSB converter can identify the correct status for the first one, two (in this example) or even three bits of the conversion whilst the main converter is idle. The values of the most significant bits can then be passed via the controller 6 to the main converter 2 such that the voltage swings at the input to the comparator 10 are always modest or small for the main converter. This means that the comparator 10 can be optimised for use over a small and known voltage input range (typically centred around the middle of the supply voltage).

In testing, this arrangement has enabled the input frequency of an analog to digital converter to be extended from 5 MHz to 30 MHz for the same accuracy and resolution.

Figure 5:
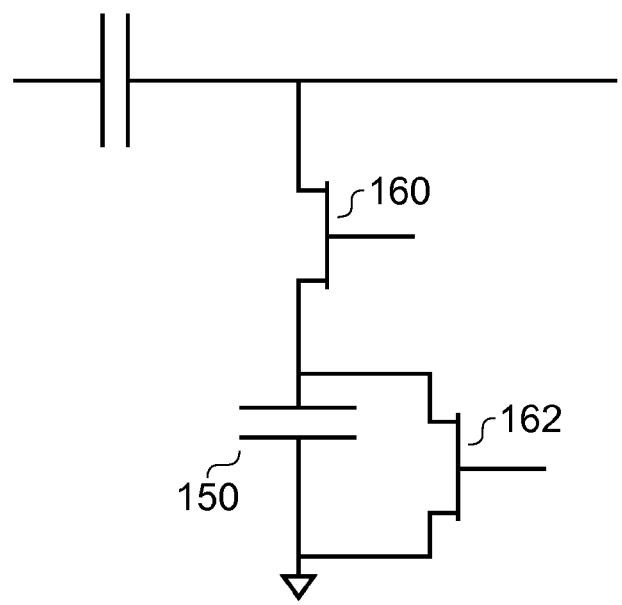
FIG. 5 shows an alternative configuration of switches and a load or attenuation capacitor.

Other topologies are available. Thus FIG. 5 shows the load capacitor 150 and the series switch 160 reversed in order.

Figure 6:
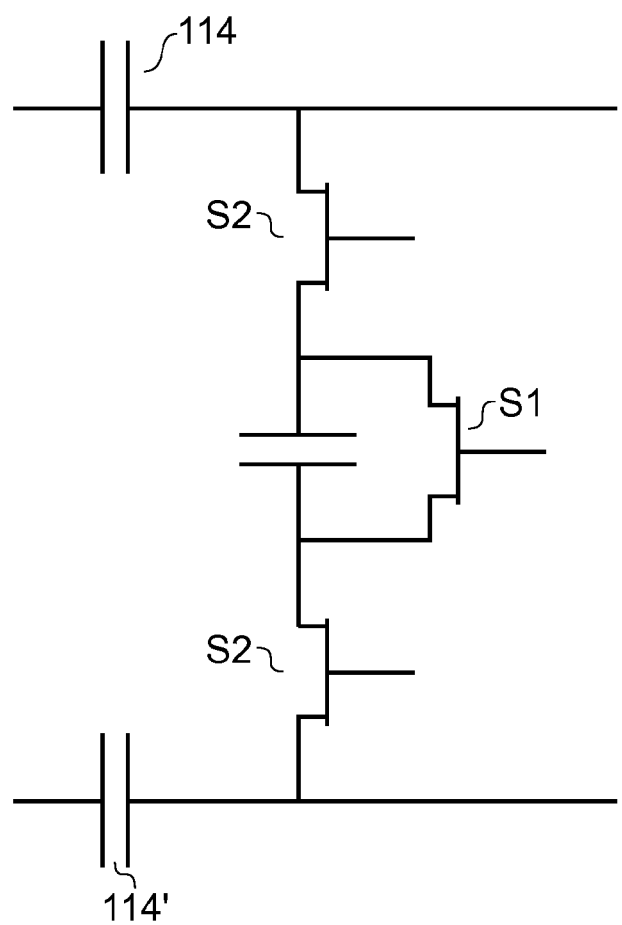
FIG. 6 shows a further embodiment of the invention

FIG. 6 shows an alternative configuration for the dual ended arrangement of FIG. 4 where a single load capacitor is placed between series connected switches. Capacitors 114 and 114' may be instantiated by C1-C4 and C1'-C4' (or similar) as shown in FIG. 4.

It is thus possible to provide an improved analog to digital converter.

The invention claimed is:

1. A most significant bits analog to digital converter for determining a first P bits of an N bit analog to digital conversion, the most significant bits analog to digital converter comprising:
 a digital to analog converter
 a capacitive attenuator, and
 a switching arrangement for inhibiting action of the attenuator during sampling and enabling the attenuator during conversion.

2. A most significant bits analog to digital converter as claimed in claim 1, in which the capacitive attenuator comprises a load capacitor in series with a switch for selectively enabling charge flow via the capacitor during conversion.

3. A most significant bits analog to digital converter as claimed in claim 2, in which the load capacitor is connected between an output node and a bias voltage.

4. A most significant bits analog to digital converter as claimed in claim 2 in which the analog to digital converter is a dual ended converter comprising first and second digital to analog converters having respective capacitive attenuators, and the load capacitors are placed in series connection or each connected to a bias voltage during conversion, or a load capacitor may be shared between the first and second digital to analog converters.

5. A most significant bits analog to digital as claimed in claim 2, further comprising a shorting switch in parallel with the load capacitor for providing a low impedance path to discharge the load capacitor during sampling.

6. A most significant bits analog to digital converter as claimed in claim 5, in which the shorting switch is placed in a high impedance states during conversion.

7. A most significant bits analog to digital converter as claimed in claim 1, in which the capacitive attenuator comprises first and second capacitors, with a first capacitor extending between an input of the attenuator and an output of the attenuator, and a second capacitor selectively connectable between the output of the attenuator and a further node, the second capacitor being disconnected from one of the output and the further node during sampling of a signal to be converted, and reconnected while the signal is being converted.

8. A most significant bits analog to digital converter as claimed in claim 7, in which the first capacitor acts as a sampling capacitor.

9. A most significant bits analog to digital converter as claimed in claim 2, in which the digital to analog converter comprises a switched capacitor array, and the capacitors of the array cooperate with the load capacitor to form the capacitive attenuator.

10. An analog to digital converter comprising a combination of a main converter and a most significant bits converter as claimed in claim 1, wherein, is use, the most significant bits converter is used to trial the first P bits, and the result is then passed to the main converter which has its first P bits set in accordance with the values determined by the most significant bits converter.

11. An analog to digital converter as claimed in claim 10, where the main converter has redundancy.

12. A method of performing an analog to digital conversion comprising:
 converting a first group of bits using a first conversion process, wherein the first group of bits are most significant bits, where
  during a conversion phase, attenuating an input signal, and
  during a sampling phase, not attenuating the input signal; and
 converting remaining non-most significant bits using a second conversion process.

13. A method as claimed in claim 12, wherein the results of the first conversion process are passed to the second conversion process.

14. A method as claimed in claim 12, wherein during the first conversion, a load capacitor is selectively coupled to the input of a comparator so as to cooperate with a sampling capacitor to form a capacitive voltage divider.

15. A method as claimed in claim 14, wherein the second conversion process is performed by a digital to analog converter comprising a plurality of capacitors having switches associated therewith where respective first terminals of the capacitors can be selectively connected to a first reference voltage or a second reference voltage, and second terminals of the capacitors are connected to an output node of the digital to analog converter, and wherein a signal to be converted can also be sampled onto at least one of the capacitors.

* * * * *